US007833821B2

(12) United States Patent
Basol

(10) Patent No.: US 7,833,821 B2
(45) Date of Patent: Nov. 16, 2010

(54) METHOD AND APPARATUS FOR THIN FILM SOLAR CELL MANUFACTURING

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 466 days.

(21) Appl. No.: 11/552,503

(22) Filed: Oct. 24, 2006

(65) Prior Publication Data

US 2007/0093059 A1 Apr. 26, 2007

Related U.S. Application Data

(60) Provisional application No. 60/729,846, filed on Oct. 24, 2005.

(51) Int. Cl.
*H01L 21/00* (2006.01)

(52) U.S. Cl. ........................... 438/95; 438/84; 438/102; 257/E21.068; 257/E21.462

(58) Field of Classification Search ............. 204/192.1, 204/298.12, 298.13; 438/687, FOR. 358, 438/84, 93, 95, 102, 800, FOR. 139; 257/E21.068, 257/E21.462, E25.007, E31.027; 252/518.2; 136/264, 265

See application file for complete search history.

(56) References Cited

U.S. PATENT DOCUMENTS 4,798,660 A 1/1989 Ermer et al.
5,094,787 A * 3/1992 Nakajima et al. ........... 264/674
6,048,442 A 4/2000 Kushiya et al.
6,092,669 A 7/2000 Kushiya et al.
2002/0014406 A1 * 2/2002 Takashima ............. 204/298.13
2004/0063320 A1 * 4/2004 Hollars ....................... 438/689
2004/0219730 A1 * 11/2004 Basol ......................... 438/200
2005/0006221 A1 * 1/2005 Takeuchi et al. ......... 204/192.1
2005/0028861 A1 * 2/2005 Aoki et al. .................. 136/256
2008/0110746 A1 * 5/2008 Kardokus et al. ...... 204/192.12

OTHER PUBLICATIONS

Suryanarayana, C., et al., "Phase selection in a mechanically alloyed Cu-In-Ga-Se powder mixture," J. Mater. Res.14, vol. 14 ( No. 2), p. 377-383, (Feb. 1999).
Suryanarayana, C. et al., "Synthesis and processing of a Cu-In-Ga-Se sputtering target," Thin Solid Films 332, p. 340-344, (1998).
Van Zant, P., *Microchip Fabrication: A Practical Guide to Semiconductor Processing*, 3rd Ed., Ch. 13, pp. 404-409 (1996).

* cited by examiner

*Primary Examiner*—Matthew S Smith
*Assistant Examiner*—Quovaunda Jefferson
(74) *Attorney, Agent, or Firm*—Pillsbury Winthrop Shaw Pittman LLP

(57) ABSTRACT

The present invention provides a method of making a Cu—In—Ga sputtering target by melting Cu, In and Ga, Cu and In or Cu and Ga to form a uniform melt with a pre-determined stoichiometry, which melt is sprayed to cause sprayed uniform melt particles to solidify into Cu—In—Ga particles with the pre-determined stoichiometry. The sputtering target is then made using the Cu—In—Ga particles. In a further aspect of the invention, there is provided a method of producing a thin film absorber layer for solar cell fabrication by sputter depositing a precursor film with a first composition

15 Claims, 1 Drawing Sheet

METHOD AND APPARATUS FOR THIN FILM SOLAR CELL MANUFACTURING

CLAIM OF PRIORITY

This application claims priority to U.S. Provisional Application Ser. No. 60/729,846 filed Oct. 24, 2005, which is incorporated herein by reference in its entirety.

FIELD OF THE INVENTION

The present invention relates to method and apparatus for preparing thin films of semiconductor films for radiation detector and photovoltaic applications.

BACKGROUND

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leqq x \leqq 1$, $0 \leqq y \leqq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13, which is previously deposited on the substrate 11 and which acts as the electrical contact to the device. The substrate 11 and the conductive layer 13 may be collectively called a base 16. Various conductive layers comprising Mo, Ta, W, Ti, and stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIAVIA compound absorber, the cell efficiency is a strong function of the molar ratio of IB/IIIA. If there are more than one Group IIIA materials in the composition. the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. It is important for a thin film deposition process to have the capability of controlling both the molar ratio of IB/IIIA. and the molar ratios of the Group IIIA components in the composition. It should be noted that although the chemical formula is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly. $Cu(In,Ga)(S,Se)_2$ means the whole family of compounds with Ga/(Ga+In) molar ratio varying from 0 to 1, and Se/(Se+S) molar ratio varying from 0 to 1.

One prior-art technique used for growing $Cu(In,Ga)(S,Se)_2$ type compound thin films for solar cell applications is a two-stage process where metallic components of the $Cu(In,Ga)(S,Se)_2$ material are first deposited onto a substrate, and then reacted with S and/or Se in a high temperature annealing process. For example, for $CuInSe_2$ growth, thin layers of Cu and In are first deposited on a substrate and then this stacked precursor layer is reacted with Se at elevated temperature. If the reaction atmosphere also contains sulfur, then a $CuIn(S,Se)_2$ layer can be grown. Addition of Ga in the precursor layer, i.e. use of a Cu/In/Ga stacked film precursor, allows the growth of a $Cu(In,Ga)(S,Se)_2$ absorber.

Sputtering techniques has been used in prior art approaches to deposit the layers containing the Group IB and Group IIIA components of the precursor stacks. In the case of $CuInSe_2$ growth, for example, Cu and In layers were sequentially sputter-deposited on a substrate and then the stacked film was heated in the presence of gas containing Se at elevated temperature for times typically longer than about 30 minutes, as described in U.S. Pat. No. 4.798,660. More recently U.S. Pat. No. 6,048,442 disclosed a method comprising sputter-depositing a Cu—Ga alloy layer and then an In layer to form a Cu—Ga/In stack on a metallic back electrode layer and then reacting this precursor stack film with one of Se and S to form the absorber layer. U.S. Pat. No. 6,092,669 described sputtering-based equipment for producing such absorber layers.

In a two-stage process employing stacked layers such as a Cu/In/Ga stack comprising separate Cu, Ga and In sub-layers or a Cu—Ga/In stack comprising a Cu—Ga sublayer and a In sub-layer, controlling local and global thickness uniformities of each sub-layer of the stack is very important. For example, to grow a $Cu(In,Ga)(S,Se)_2$ absorber film, individual thicknesses of the sub-layers forming the metallic stacked structure need to be controlled so that the two molar ratios mentioned before, i.e. the Cu/(In+Ga) ratio and the Ga/(Ga+In) ratio, can be kept under control from run to run and everywhere on large area substrates that are needed for manufacturing large volume of solar cells. This is difficult because in a sputtering technique employing a large Cu—Ga target and a large In target, for example, as the targets are consumed thickness uniformity of the Cu—Ga film deposited from the Cu—Ga target onto a large substrate changes. Thickness uniformity of the In film deposited on the Cu/Ga film also changes. However since the amounts of the two materials deposited on the substrate are not exactly the same the two targets erode differently and therefore the thickness uniformities or thickness profiles of the deposited Cu—Ga and In layers are not exactly the same. This means that on a large substrate as more and more depositions are carried out the critical molar ratios of Cu/(In+Ga) and Ga/(Ga+In) would change from one location to the other. This causes low yields and device efficiency loss in a manufacturing environment.

Therefore there is a need to develop techniques that can deposit compositionally uniform precursor film on large area substrates.

SUMMARY OF THE INVENTION

The present invention provides a method for preparing thin films of semiconductor films for radiation detector and photovoltaic applications.

In one aspect, the present invention provides a method of making a Cu—In—Ga sputtering target by melting Cu, In and Ga to form a uniform melt with a pre-determined stoichiometry; spraying the uniform melt into a gas having a lower temperature than the uniform melt, thereby causing the sprayed uniform melt particles to solidify into Cu—In—Ga particles with the pre-determined stoichiometry; and forming the Cu—In—Ga sputtering target with a composition using the Cu—In—Ga particles.

In another aspect, when making a Cu—In—Ga sputtering target, the uniform melt is Cu—In or Cu—Ga.

In a further aspect of the invention, there is provided a method of producing a thin film absorber layer for solar cell fabrication by sputter depositing a precursor film with a first composition and comprising Cu, In and Ga; and reacting the precursor film with at least one Group VIA material thereby forming a $Cu(In,Ga)(VIA)_2$ compound, wherein the step of sputter depositing deposits the precursor film from at least one target comprising Cu, In and Ga.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION

Present invention overcomes the shortcomings of known techniques by addressing the important manufacturability and yield issues such as run-to-run compositional control in large area substrates.

Figure 1:
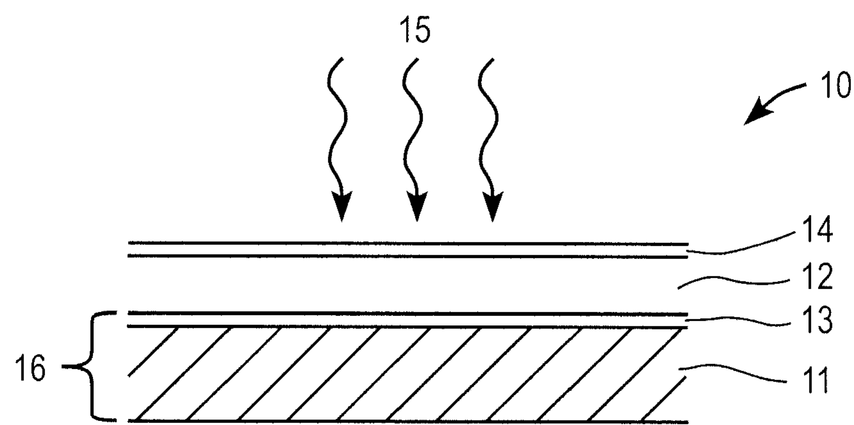
FIG. 1 is a cross-sectional view of a solar cell employing a Group IBIIIAVIA absorber layer.
Figure 2:
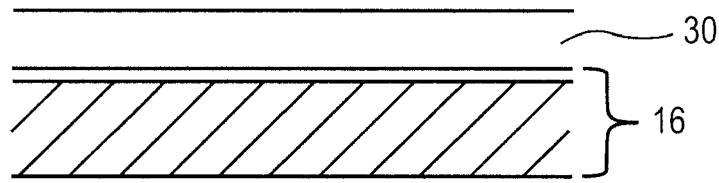
FIG. 2 is a cross-sectional view of a precursor layer deposited on a base.

In one embodiment, a sputtering target is prepared comprising substantially all the metallic precursor components in their desired, predetermined composition. For example to grow a $Cu(In,Ga)(S,Se)_2$ compound layer with a predetermined Cu/(Ga+In) ratio of 1.0 and Ga/(Ga+In) ratio of 0.3, a metallic target is prepared comprising Cu, In and Ga with a Cu/(Ga+In) ratio of about 1.0 and Ga/(Ga+In) ratio of about 0.3. A precursor layer 30 comprising Cu, In and Ga with substantially the same Cu/(In+Ga) and Ga/(Ga+In) ratios is then sputter deposited on a base 16 forming the structure shown in FIG. 2, to form a Cu—Ga—In precursor layer. The precursor layer is then reacted with Se to form the final compound. It should be noted that in this approach if there is any change in the thickness profile of the deposited precursor film due to the consumption of the target run after run, although the absolute value of thickness of the precursor may be changing on the substrate. the above mentioned molar ratios will not be changing. Therefore., the composition of the compound film after reaction with Se would be substantially uniform.

It is challenging to fabricate a large Cu—In—Ga target that is compositionally uniform, using melting and quenching techniques. However, such targets may be prepared using nano-powders comprising Cu, In and Ga. For example, to obtain a target with desired Cu/(In+Ga) ratio of 1.0 and Ga/(Ga+In) ratio of 0.3, the following approaches may be utilized.

1 A Cu+In+Ga uniform melt with the desired molar ratios of 1.0 and 0.3 may be sprayed into inert gas and nano-powder with particle size of <5 um, preferably <0.5 um may be obtained. Each particle in such nanopowder has the desired molar ratio since it has been formed from a uniform melt. When a target is fabricated from such a powder by cold pressing or pressing under low temperature, a compositionally uniform target is obtained.

2. A Cu—Ga nano powder may be mixed with an In nano powder at a ratio that yields a Cu/(In+Ga) ratio of 1.0 and Ga/(Ga+In) ratio of 0.3. After intimately mixing the two powders a composite nanopowder is obtained. Composite nanopowder is then used to form a target with uniform composition as described in approach 1.

3. A Cu—Ga nano powder may be mixed with a Cu—In nano powder at a ratio that yields a Cu/(In+Ga) ratio of 1.0 and Ga/(Ga+In) ratio of 0.3. After intimately mixing the two powders a composite nanopowder is obtained. Composite nanopowder is then used to form a target with uniform composition as described in approach 1.

4. A Cu—Ga nano powder may be mixed with a Cu—In nano powder and a In—Ga nanopowder at a ratio that yields a Cu/(In+Ga) ratio of 1.0 and Ga/(Ga+In) ratio of 0.3. After intimately mixing the two powders a composite nanopowder is obtained. Composite nanopowder is then used to form a target with uniform composition as described in approach 1.

It should be noted that the composite nanopowder compositions may also comprise elemental nanopowders. In summary the nanopowders used for preparation of the composite nanopowders which may be employed to fabricate targets may comprise at least one of Cu nano particles, Cu—Ga nano particles, Cu—In nano particles, In nano particles and In—Ga nanoparticles. Ga nanopanicles may also be utilized but because of their low melting points they are more difficult to handle.

Although the above description is set forth in terms of a single deposition step for the precursor layer. it is possible to carry out the precursor deposition in two or more steps either using similar targets or targets with somewhat different compositions as will be described next.

Figure 3:
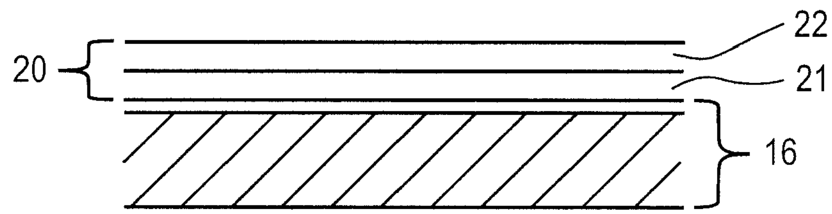
FIG. 3 is a cross-sectional view of a precursor layer comprising two precursor sub-layers deposited on a base.

To achieve some degree of compositional gradient through the deposited precursor layer it is possible to use more than one target and deposit precursor sub-layers in a consecutive manner from these targets to form the precursor layer. For example, a first target may be formed as described above with Cu, In and Ga content such that Cu/(In+Ga) ratio may be 1.0 and the Ga/(In+Ga) ratio may be 0.4. A second target may be formed with Cu, In and Ga content such that Cu/(In+Ga) ratio may be 1.0 and the Ga/(In+Ga) ratio may be 0.2. As shown in FIG. 3, a precursor layer 20 may be formed on a base 16 by depositing a first precursor sub-layer 21 using the first target and a second precursor sub-layer 22 using the second target. By adjusting the relative thickness of the first precursor sub-layer and the second precursor sub-layer the distribution of Ga through the precursor layer 20 is controlled and the overall Ga/(Ga+In) ratio is changed while keeping the Cu/(In+Ga) ratio constant. It is of course possible to have different Cu/(In+Ga) ratios in the first and second targets. In this case, however, it is preferred that the ratios are selected within an acceptable window, for example within the range of 0.6-1.0 so that it is impossible for the final precursor layer 20 to have a Cu/(Ga+In) ratio of above 1.0. Otherwise relative thicknesses of the precursor sub-layers need to be closely controlled. In case different targets are prepared with different Cu/(In+Ga) ratios, the Ga/(Ga+In) ratios may or may not be the same. For example, the first precursor sub-layer 21 of FIG. 3 may be deposited from a first target with Cu/(Ga+In) ratio of 1.0 and Ga/(Ga+In) ratio of 0.3. The second precursor sub-layer 22 may be deposited from a second target with Cu/(Ga+In) ratio of 0.6 and Ga/(Ga+In) ratio of 0.3. This way the compositional gradient through the precursor layer 20 is in the Cu/(Ga+In) ratio but not in the Ga/(Ga+In) ratio. Obviously both ratios may be changed in the first and second targets in which case, as stated earlier, individual thickness control for the first precursor sub-layer 21 and the second precursor sub-layer 22 become more critical.

Referring back to the sputter deposition process, once the compositionally uniform target is formed it is important to preserve this compositional uniformity and to transfer it to the sputtered film. Since the target comprises low temperature phases such as Ga it is preferable to efficiently cool the target during sputtering so that the low melting point phases do not largely separate. Cooling of the target may be achieved using chilled solutions and even liquid nitrogen. Target may be mounted on backing plates with high thermal conductivity (such as Cu) and the backing plates may be cooled to temperatures below 10 C. Alternately target may be directly cooled. The backing plate may have fins extending into the target to better cool the target.

After deposition of the Cu—Ga—In precursor layer. it is possible to deposit a Group IIIA rich cap layer such as a Ga or In cap layer over the precursor film because Group IIIA -rich surfaces are beneficial for high efficiency device fabrication. The thickness of this cap layer may be in the 5-20 nm range so that it does not change the overall stoichiometry greatly. It is also possible to add Group VIA material(s) such as S and/or Se into the composite powder used for target manufacturing. As long as there is no substantial amount of $Cu(In,Ga)(S,Se)_2$ compound particles in the targets the present invention may be practiced with targets comprising some Group VIA materials. With small amount of Se and/or S present in the targets the high conductivity of the target is preserved due to the metallic nature of the overall target, but presence of Group VIA materials arrests melting of the low melting phases such as Ga and/or In. In that respect. in another embodiment the composite nanopowders may comprise at least one of S nanopowder, Se nanopowder, S-Se nanopowder, In—Se nanopowder, Ga—Se nanopowder, and In—Ga—Se nanopowder in addition to at least one of the metallic nanopowders of Cu, In, Cu—In, Cu—Ga, Cu—In—Ga and In—Ga.

Since the targets are substantially metallic, high rate DC magnetron sputtering techniques may be used to deposit the substantially metallic precursor layers on the base. After deposition the precursor layer may be subjected to an optional treatment step which may comprise heating, microwave treating, laser treating etc. Treatment may be carried out in air, in vacuum, in a reducing atmosphere or in a substantially inert atmosphere at a temperature within the range of 50-350 ° C., preferably within the range of 80-200° C., for a time period varying from one second for the case of laser treating to 30 minutes for the case of furnace annealing. Preferably treatment is carried out for a period of 5-600 seconds, more preferably for 3-300 seconds. After the treatment step the treated precursor layer may be reacted with at least one Group VIA material to form a Group IBIIIAVIA compound layer with high density and good micro-scale compositional uniformity. It should be noted that the precursor layer may be reacted with a Group VIA material without carrying out the treatment step which is optional. This way a Group IBIIIAVIA compound layer with good micro-scale compositional uniformity may also be formed.

The reaction step may be performed in various ways. For example, the precursor layer such as those depicted in FIGS. 2 and 3 and those described in previous paragraphs. may be reacted in an atmosphere comprising gaseous Group VIA species such as hydrogen selenide and/or sulfide gases, selenium and/or sulfur vapors etc. Alternately or additionally reaction may be achieved by depositing at least one Group VIA material on the precursor layer and heating up the resulting composite structure. The reaction step may be carried out at a temperature range of 350-600 C., preferably a range of 400-550 C. for times ranging from 5 minutes to 60 minutes. Group VIA materials may be evaporated on, sputtered on or electroplated on the precursor layer. Alternately inks comprising Group VIA nano particles may be prepared and these inks may be deposited on the precursor layers to form a Group VIA material layer comprising Group VIA nano particles. Dipping, spraying, doctor-blading or ink writing techniques may be employed to deposit such layers.

Solar cells may be fabricated on the compound layers of the present invention using materials and methods well known in the field. For example a thin (<0.1 microns) CdS layer may be deposited on the surface of the compound layer using the chemical dip method. A transparent window of ZnO may be deposited over the CdS layer using MOCVD or sputtering techniques. A metallic finger pattern is optionally deposited over the ZnO to complete the solar cell. Solar cells may be either monolithically integrated on single substrates to form modules or they may be separately interconnected and integrated for module manufacturing.

Although the present invention is described with respect to certain preferred embodiments, modifications thereto will be apparent to those skilled in the art.

What is claimed:

1. A method of producing a thin film absorber layer for solar cell fabrication comprising:

providing a single compositionally uniform Cu—In—Ga target, wherein the single compositionally uniform Cu—In—Ga target is formed solely of a plurality of different solid particles that were each separately formed, intermixed to be compositionally uniformly distributed, and then compressed together, wherein the plurality of different solid particles include at least a plurality of alloy particles, with each of said plurality of alloy particles including at least two of Cu, In and Ga therein, wherein said plurality of different solid particles have a pre-determined stoichiometry, and wherein no Group VIA material is within the compositionally uniform Cu—In—Ga target;

sputter depositing a precursor film with a first composition and comprising Cu, In and Ga using, as an only target, the single compositionally uniform Cu—In—Ga target, wherein the step of sputter depositing occurs in the absence of a Group VIA material, and wherein the step of sputter depositing further occurs with the single compositionally uniform Cu—In—Ga target being cooled below about 10° C. during the step of sputter depositing; and after completion of the sputter depositing, reacting the precursor film with at least one Group VIA material thereby forming a $Cu(In,Ga)(VIA)_2$ compound on the solar cell to produce said absorber layer.

2. The method of claim 1 wherein the first composition has Cu/(In—Ga) molar ratio of less than or equal to 1.0.

3. The method of claim 1 wherein the single compositionally uniform Cu—In—Ga target is made solely from a plurality of Cu—In—Ga particles that were each separately formed, intermixed to be compositionally uniformly distributed with the plurality of different solid particles, and then compressed together to form the single compositionally uniform Cu—In—Ga target, such that the plurality of different solid particles are made solely of the plurality of Cu—In—Ga particles.

4. The method of claim 3 wherein the Cu—In—Ga particles are separately formed by a method comprising: preparing a melt comprising Cu, In and Ga, and having the first composition; and spraying the melt into a gas having a lower temperature than the melt, thereby causing the sprayed melt particles to solidify into the Cu—In—Ga particles with the first composition and the pre-determined stoichiometry.

5. The method according to claim 4 wherein the gas is an inert gas.

6. The method according to claim 5 wherein the pre-determined stoichiometry is the same as the first composition.

7. The method according to claim 6 wherein the pre-determined stoichiometry has a Cu/(In+Ga) molar ratio of less than or equal to 1.0.

8. The method according to claim 4 wherein the step of spraying further includes using Cu—In—Ga particles that are uniformly mixed.

9. The method according to claim 3 wherein the step of sputter depositing uses a direct current.

10. The method of claim 1 wherein the plurality of different alloy particles are made from Cu—In particles and Cu—Ga particles, which Cu—In particles and Cu—Ga particles are each separately formed, intermixed to be compositionally uniformly distributed with the plurality of different solid particles, and then compressed together to form the single compositionally uniform Cu—In—Ga target.

11. The method of claim 10 wherein the plurality of different solid particles are further made from at least one of Cu—In—Ga particles, Cu particles, In particles, and Ga particles which are each separately formed, intermixed to be compositionally uniformly distributed with the plurality of different solid particles, and then compressed together to form the single compositionally uniform Cu—In—Ga target.

12. The method of claim 1 wherein the plurality of different alloy particles are made from Cu—In particles, Cu—Ga particles and In—Ga particles, which Cu—In particles, Cu—Ga particles, and In—Ga particles are each separately formed, intermixed to be compositionally uniformly distributed with the plurality of different solid particles, and then compressed together to form the single compositionally uniform Cu—In—Ga target.

13. The method of claim 1 wherein the plurality of different alloy particles are made from Cu—Ga particles, wherein the plurality of different solid particles further includes In particles, wherein the plurality of different solid particles are only Cu—Ga particles and In particles, wherein the Cu—Ga particles and the In particles are each separately formed, intermixed to be compositionally uniformly distributed with the plurality of different solid particles, and then compressed together to form the single compositionally uniform Cu—In—Ga target.

14. The method according to claim 1 wherein the step of sputter depositing uses a direct current.

15. The method according to claim 1, wherein the plurality of particles are compressed together using a cold pressing process.

* * * * *